United States Patent
Hagimoto et al.

(10) Patent No.: US 10,115,589 B2
(45) Date of Patent: Oct. 30, 2018

(54) EPITAXIAL SUBSTRATE FOR ELECTRONIC DEVICES, ELECTRONIC DEVICE, METHOD FOR PRODUCING THE EPITAXIAL SUBSTRATE FOR ELECTRONIC DEVICES, AND METHOD FOR PRODUCING THE ELECTRONIC DEVICE

(71) Applicants: SHIN-ETSU HANDOTAI CO., LTD., Tokyo (JP); SANKEN ELECTRIC CO., LTD., Niiza-shi, Saitama (JP)

(72) Inventors: Kazunori Hagimoto, Takasaki (JP); Masaru Shinomiya, Annaka (JP); Keitaro Tsuchiya, Takasaki (JP); Hirokazu Goto, Minato-ku (JP); Ken Sato, Miyoshi-machi (JP); Hiroshi Shikauchi, Niiza (JP)

(73) Assignees: SHIN-ETSU HANDOTAI CO., LTD., Tokyo (JP); SANKEN ELECTRIC CO., LTD., Niiza-shi (JP)

( * ) Notice: Subject to any disclaimer, the term of this patent is extended or adjusted under 35 U.S.C. 154(b) by 0 days.

(21) Appl. No.: 15/538,500

(22) PCT Filed: Dec. 18, 2015

(86) PCT No.: PCT/JP2015/006313
§ 371 (c)(1),
(2) Date: Jun. 21, 2017

(87) PCT Pub. No.: WO2016/110906
PCT Pub. Date: Jul. 14, 2016

(65) Prior Publication Data
US 2017/0352537 A1 Dec. 7, 2017

(30) Foreign Application Priority Data
Jan. 8, 2015 (JP) .................................. 2015-002047

(51) Int. Cl.
*H01L 21/44* (2006.01)
*H01L 27/108* (2006.01)
(Continued)

(52) U.S. Cl.
CPC .... *H01L 21/02513* (2013.01); *H01L 21/0254* (2013.01); *H01L 21/02381* (2013.01);
(Continued)

(58) Field of Classification Search
CPC ................................................. H01L 21/67366
(Continued)

(56) References Cited

U.S. PATENT DOCUMENTS

| | | | | |
|---|---|---|---|---|
| 8,653,563 B2 * | 2/2014 | Yamada | ............... | H01L 29/7787 257/183 |
| 8,709,843 B2 * | 4/2014 | Shakuda | ................. | C30B 25/14 438/29 |

(Continued)

FOREIGN PATENT DOCUMENTS

| | | |
|---|---|---|
| JP | 2011-066333 A | 3/2011 |
| JP | 2011-114267 A | 6/2011 |

(Continued)

OTHER PUBLICATIONS

Jul. 11, 2017 International Preliminary Report on Patentability issued in International Patent Application No. PCT/JP2015/006313.
(Continued)

*Primary Examiner* — Calvin Lee
(74) *Attorney, Agent, or Firm* — Oliff PLC

(57) ABSTRACT

An epitaxial substrate for electronic devices, including: a Si-based substrate; an AlN initial layer provided on the Si-based substrate; and a buffer layer provided on the AlN initial layer, wherein the roughness Sa of the surface of the AlN initial layer on the side where the buffer layer is located is 4 nm or more. As a result, an epitaxial substrate for
(Continued)

electronic devices, in which V pits in a buffer layer structure can be suppressed and longitudinal leakage current characteristics can be improved when an electronic device is fabricated therewith, is provided.

8 Claims, 16 Drawing Sheets

(51) Int. Cl.
    *H01L 21/02*     (2006.01)
    *H01L 29/78*     (2006.01)
    *H01L 29/778*     (2006.01)
    *H01L 29/20*     (2006.01)

(52) U.S. Cl.
    CPC .. *H01L 21/02458* (2013.01); *H01L 21/02507* (2013.01); *H01L 29/7786* (2013.01); *H01L 29/78* (2013.01); *H01L 29/2003* (2013.01)

(58) Field of Classification Search
    USPC .......................................... 257/309; 438/665
    See application file for complete search history.

(56) References Cited

U.S. PATENT DOCUMENTS

| | | | | |
|---|---|---|---|---|
| 8,749,009 B2 * | 6/2014 | Young | ................ | H01L 31/0481 136/243 |
| 9,006,865 B2 * | 4/2015 | Ikuta | ...................... | C30B 25/18 257/103 |
| 9,093,365 B2 * | 7/2015 | Chang | ................ | H01L 29/2003 438/478 |
| 9,337,023 B1 * | 5/2016 | Fareed | .............. | H01L 21/02513 257/77 |
| 9,564,316 B2 * | 2/2017 | Lee | ..................... | H01L 21/0254 438/778 |
| 2011/0127604 A1 | 6/2011 | Sato | | |
| 2012/0126293 A1 | 5/2012 | Sumiya et al. | | |
| 2013/0043489 A1 | 2/2013 | Kotani et al. | | |

FOREIGN PATENT DOCUMENTS

| | | |
|---|---|---|
| JP | 2013-042032 A | 2/2013 |
| WO | 2011/016304 A1 | 2/2011 |

OTHER PUBLICATIONS

Mar. 15, 2016 Search Report issued in International Patent Application No. PCT/JP2015/006313.

Oct. 18, 2016 Office Action issued in Japanese Patent Application No. JP 2015-002047.

Mar. 14, 2017 Office Action issued in Japanese Patent Application No. 2015-002047.

May 4, 2017 Office Action issued in Taiwanese Patent Application No. 104144060.

Able, A. et al., "Growth of crack-free GaN on Si(1 1 1) with graded AlGaN buffer layers", Journal of Crystal Growth, 2005, vol. 276, pp. 415-418.

* cited by examiner

FIG.9
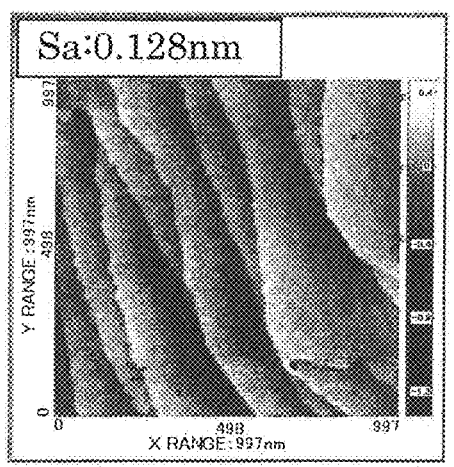
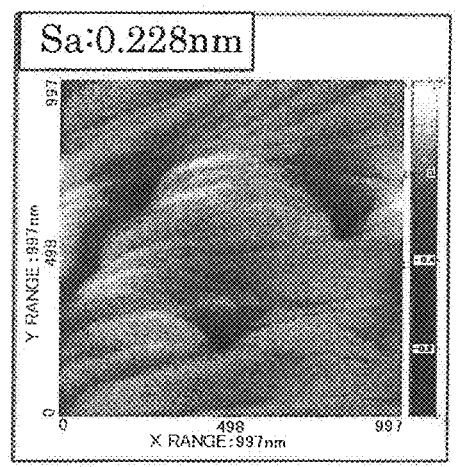
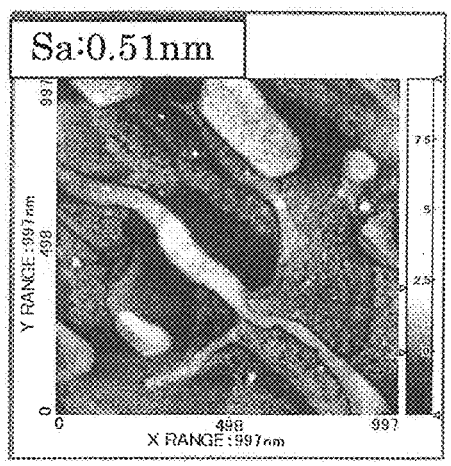

EPITAXIAL SUBSTRATE FOR ELECTRONIC DEVICES, ELECTRONIC DEVICE, METHOD FOR PRODUCING THE EPITAXIAL SUBSTRATE FOR ELECTRONIC DEVICES, AND METHOD FOR PRODUCING THE ELECTRONIC DEVICE

TECHNICAL FIELD

The present invention relates to epitaxial substrates for electronic devices, electronic devices, methods for producing the epitaxial substrate for electronic devices, and methods for producing the electronic device.

BACKGROUND ART

Regarding the technique of producing a compound semiconductor epitaxial wafer for electronic devices, a study of a method for producing a semiconductor epitaxial wafer with a GaN film formed on a Si substrate by epitaxial growth, the method that can improve the electrical characteristics thereof, in particular, a leakage current in a longitudinal direction, is conducted.

In such a study, after the production of a semiconductor epitaxial wafer, a device is fabricated on the front surface of the semiconductor epitaxial wafer and the electrical characteristics are then evaluated.

In the past, it has been assumed that a flat surface of a base on which epitaxial growth is to be performed is preferable in performing epitaxial growth.

For instance, Patent Document 1 mentions the roughness of an AlN layer of an initial layer and discloses setting the surface roughness Ra of a silicon substrate in contact with the AlN layer at 0.2 to 1 nm and thereby improving the crystallinity of a group-III nitride semiconductor which is grown above the silicon substrate. However, Patent Document 1 makes no mention of electrical characteristics.

CITATION LIST

Patent Literature

Patent Document 1: Japanese Unexamined Patent Application publication (Kokai) No. 2011-066333

SUMMARY OF INVENTION

Problem to be Solved by the Invention

The present inventors of the present invention have conducted a study of the electrical characteristics of the above-described epitaxial wafer and found out that there is a correlation between V pits in a buffer layer structure and longitudinal leakage current characteristics; the smaller the number of V pits in the buffer layer structure is, the smaller a longitudinal leakage current becomes.

However, there is room for a study about how to suppress V pits in the buffer layer structure.

The present invention has been made in view of the above-described problem, and an object thereof is to provide an epitaxial substrate for electronic devices, in which V pits in a buffer layer structure can be suppressed and current leakage characteristics can be improved when electronic device is fabricated therewith.

Means for Solving Problem

To attain the above-described object, the present invention provides an epitaxial substrate for electronic devices including: a Si-based substrate; an AlN initial layer provided on the Si-based substrate; and a buffer layer provided on the AlN initial layer, wherein the roughness Sa of the surface of the AlN initial layer on the side where the buffer layer is located, is 4 nm or more.

As described above, when the roughness Sa of the surface of the AlN initial layer on the side where the buffer layer is located is 4 nm or more, it is possible to suppress V pits in a buffer layer structure which is formed on the AlN initial layer and improve longitudinal leakage current characteristics when an electronic device is fabricated therewith.

At this time, it is preferable that the roughness Sa of the surface of the AlN initial layer on the side where the buffer layer is located is 8 nm or less.

As described above, when the roughness Sa of the surface of the AlN initial layer on the side where the buffer layer is located is 8 nm or less, it is possible to suppress reliably V pits in the buffer layer structure which, is formed on the AlN initial layer.

At this time, it is preferable that the buffer layer includes an $Al_zGa_{1-z}N$ ($0 \leq z < 1$) layer which is in contact with the AlN initial layer and the roughness Sa of the surface of the $Al_zGa_{1-z}N$ ($0 \leq z < 1$) layer on the side opposite to the AlN initial layer is 0.6 nm or less.

As described above, when the roughness Sa of the surface of the $Al_zGa_{1-z}N$ layer on the side opposite to the AlN initial layer is 0.6 nm or less, it is possible to improve effectively longitudinal leakage current characteristics when an electronic device is fabricated therewith.

At this time, it is preferable that the buffer layer includes a multilayer film that is in contact with the $Al_zGa_{1-z}N$ ($0 \leq z < 1$) layer and is composed of $Al_xGa_{1-x}N$ ($0 < x \leq 1$) layers and $Al_yGa_{1-y}N$ ($0 \leq y < x$) layers which are alternately stacked and the roughness Sa of the surface of the multilayer film on the side opposite to the $Al_zGa_{1-z}N$ ($0 \leq z < 1$) layer is 0.3 nm or less.

As described above, when the roughness Sa of the surface of the multilayer film on the side opposite to the $Al_zGa_{1-z}N$ ($0 \leq z < 1$) layer is 0.3 nm or less, it is possible to improve more effectively longitudinal leakage current characteristics when an electronic device is fabricated therewith.

At this time, it is preferable that the epitaxial substrate for electronic devices further includes: a channel layer provided on the buffer layer; a barrier layer provided on the channel layer; and a cap layer provided on the barrier layer.

With such a configuration, it is possible to use the epitaxial substrate suitably as an epitaxial substrate for electronic devices.

Moreover, the present invention provides an electronic device that is fabricated by using the above-described epitaxial substrate for electronic devices, wherein, on the epitaxial substrate for electronic devices, electrodes are provided.

With such an electronic device, it is possible to suppress V pits in the buffer layer structure which is formed on the AlN initial layer and improve longitudinal leakage current characteristics.

Furthermore, the present invention provides a method for producing an epitaxial substrate for electronic devices, the method including: forming an AlN initial layer on a Si-based substrate; forming a buffer layer on the AlN initial layer; forming a channel layer on the buffer layer; forming a barrier layer on the channel layer; and forming a cap layer on the barrier layer, wherein the roughness Sa of the surface of the AlN initial layer on the side where the buffer layer is located is set at 4 nm or more.

With such a method for producing an epitaxial substrate for electronic devices, it is possible to produce an epitaxial substrate for electronic devices, the epitaxial substrate in which V pits in a buffer layer structure which is formed on the AlN initial layer are suppressed and longitudinal leakage current characteristics are improved when an electronic device is fabricated therewith.

In addition, the present invention provides a method for producing an electronic device, the method including: forming an AlN initial layer on a Si-based substrate; forming a buffer layer on the AlN initial layer; forming a channel layer on the buffer layer; forming a barrier layer on the channel layer; a step of forming a cap layer on the barrier layer; and forming electrodes on the cap layer, wherein the roughness Sa of the surface of the AlN initial layer on the side where the buffer layer is located is set at 4 nm or more.

With such a method for producing an electronic device, it is possible to produce an electronic device in which V pits in a buffer layer structure which is formed on the AlN initial layer are suppressed and longitudinal leakage current characteristics are improved.

Effect of the Invention

As described above, according to the present invention, it is possible to suppress V pits in a buffer layer structure which is formed on an AlN initial layer and improve longitudinal leakage current characteristics when an electronic device is fabricated.

BRIEF DESCRIPTION OF DRAWINGS

FIG. 9 is a diagram depicting photographs of the surface of an $Al_zGa_{1-z}N$ ($0 \le z < 1$) layer (a first layer) after the growth of the $Al_zGa_{1-z}N$ ($0 \le z < 1$) layer (the first layer) in Example;

BEST MODE FOR CARRYING OUT THE INVENTION

Hereinafter, the present invention will be described in detail as an example of an embodiment with reference to the drawings, but the present invention is not limited thereto.

As described earlier, the present inventors conducted a study of the electrical characteristics of an epitaxial wafer with a GaN film formed on a Si substrate by epitaxial growth. In the study, the present inventors arbitrarily selected wafers with poor longitudinal leakage current characteristics and wafers with good leakage current characteristics, divided each wafer into two parts, and evaluated the longitudinal leakage current characteristics of one of the halved parts of each wafer and conducted a failure analysis (observation of the cross-section) of the other.

The failure analysis was conducted as follows: the epitaxial wafer was cleaved and the cross-section thereof was observed with the magnification of a SEM being set at 25 k in order to observe V pits in a buffer layer structure.

Here, V pits in the buffer layer structure will be explained. Each of layers constituting a buffer layer originally have to be stacked in parallel with a substrate. A "V pit" refers to a portion (a portion enclosed in an ellipse in FIG. 13) which is not parallel to the substrate, the portion in which a depression is partially formed, and a multilayer film or an $Al_zGa_{1-z}N$ ($0 \le z < 1$) insertion layer is not flat.

Figure 13:
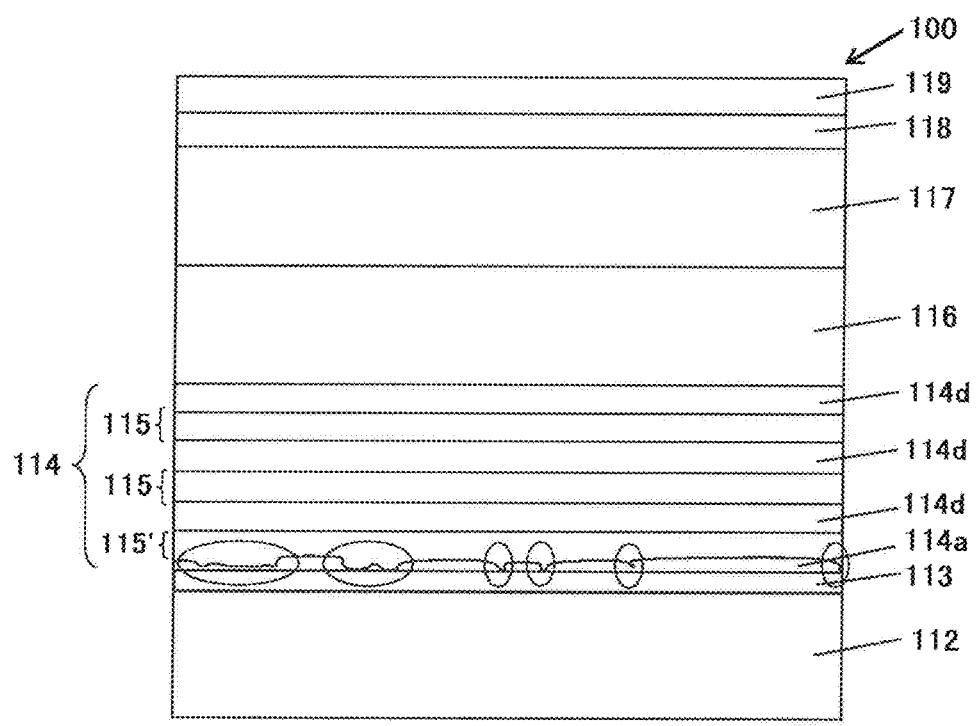
FIG. 13 is a sectional view for explaining V pits in a buffer layer structure.
Figure 14:
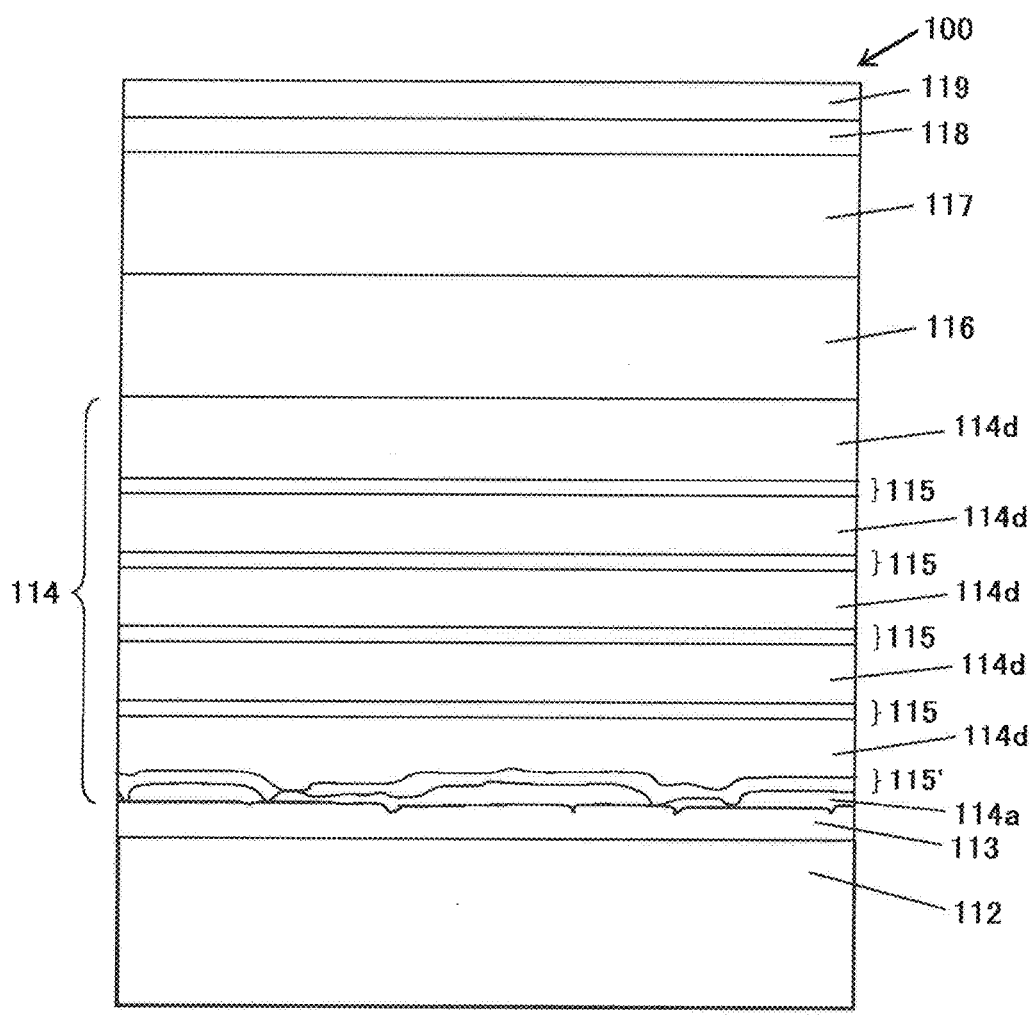
FIG. 14 is a sectional view depicting an epitaxial substrate for electronic devices, in which V pits have appeared in a buffer layer structure.

Arbitrary five spots which are not adjacent to one another (that is, five spots which are slightly apart from one another) of each wafer were observed to count the number of V pits in the buffer layer structure (refer to FIGS. 13 and 14).

Here, FIG. 13 is a sectional view for explaining V pits in the buffer layer structure and FIG. 14 is a sectional view depicting an epitaxial substrate for electronic devices, in which V pits have appeared in a buffer layer structure. Moreover, in FIGS. 13 and 14, an epitaxial substrate 100 for electronic devices includes a Si substrate 112, an AlN initial layer 113 provided on the Si substrate 112, and a buffer layer 114 provided on the AlN initial layer 113. The buffer layer 114 is formed as a result of a first layer 114a composed of $Al_zGa_{1-z}N$ and a first multilayer film 115' being stacked and $Al_zGa_{1-z}N$ ($0 \le \alpha < 1$) insertion layers 114d and second multilayer films 115 being alternately stacked further on the first multilayer film 115'. The epitaxial substrate 100 for electronic devices further includes a high-resistance layer 116 provided on the buffer layer 114, a channel layer 117 provided on the high-resistance layer 116, a barrier layer 118 provided on the channel layer 117, and a cap layer 119 provided on the barrier layer 118.

Figure 15:
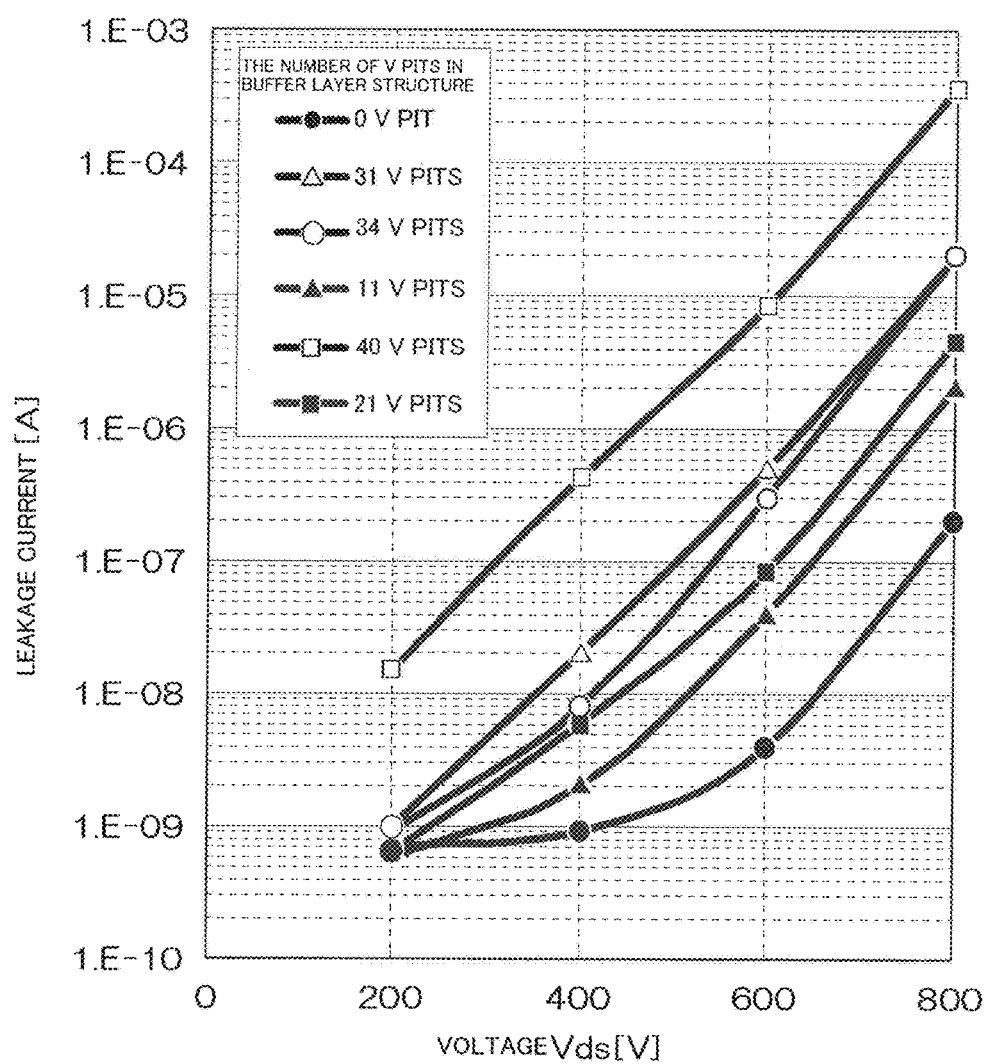
FIG. 15 is a diagram depicting longitudinal leakage current characteristics.

FIG. 15 depicts the longitudinal leakage current characteristics of each wafer. FIG. 15 also indicates the number of V pits in the surface of a buffer layer structure of each wafer.

Figure 16:
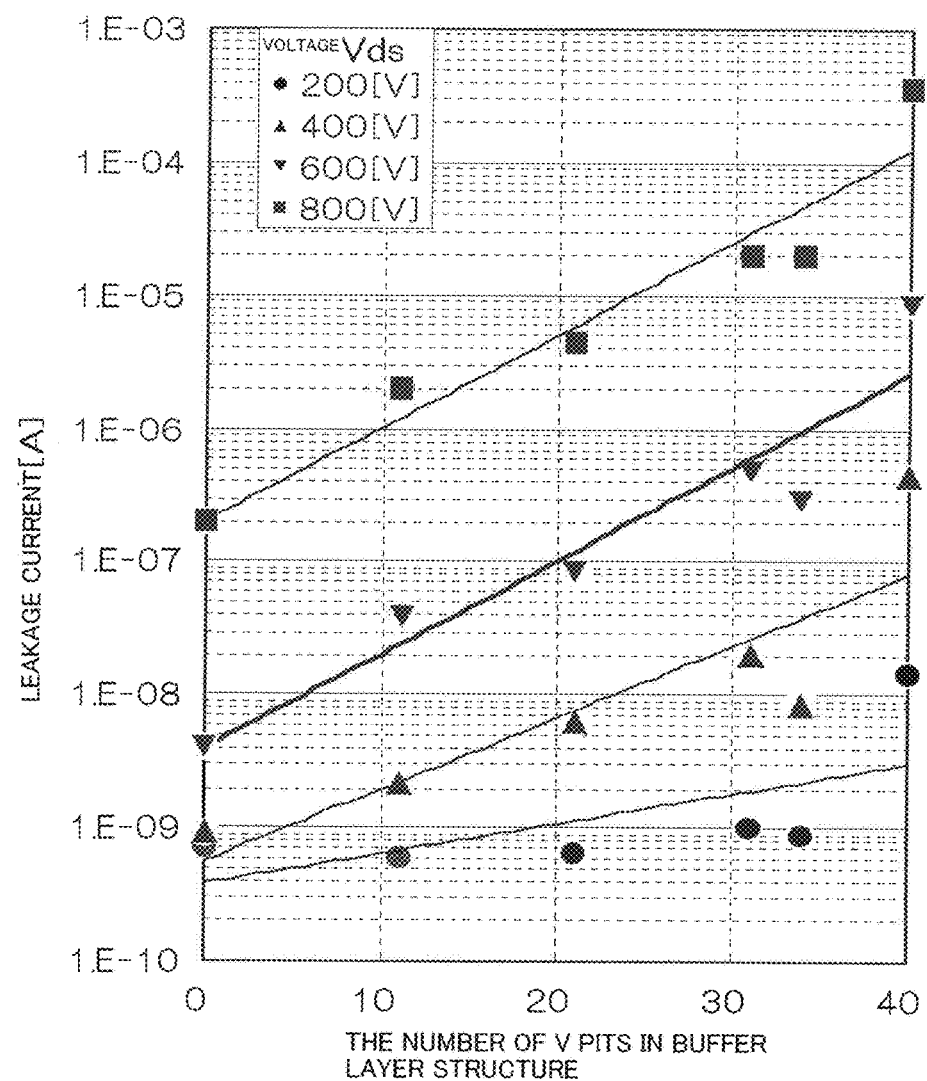
FIG. 16 is a diagram depicting the relationship between the number of V pits in a buffer layer structure and a longitudinal leakage current.

FIG. 16 is a diagram in which FIG. 15 is rewritten so as to show the relationship between the number of V pits in the surface of the buffer layer structure and a longitudinal leakage current.

FIGS. 15 and 16 reveal that the leakage current becomes larger with an increase in the number of V pits in the buffer structure.

Therefore, it is necessary to suppress V pits in the buffer layer structure in order to improve the longitudinal leakage current characteristics.

Thus, the present inventors have intensively studied an epitaxial substrate for electronic devices, in which V pits in a buffer layer structure can be suppressed and longitudinal leakage current characteristics can be improved when an electronic device is fabricated therewith. As a result, the present inventors have found out that, when the roughness Sa of the surface of an AlN initial layer on the side where a buffer layer is located is 4 nm or more, it is possible to suppress V pits in a buffer layer structure which is formed on the AlN initial layer and improve longitudinal leakage current characteristics when an electronic device is fabricated therewith, thereby bringing the present invention to completion.

First, with reference to FIGS. 1 to 3, an inventive epitaxial substrate for electronic devices will be described.

Figure 1:
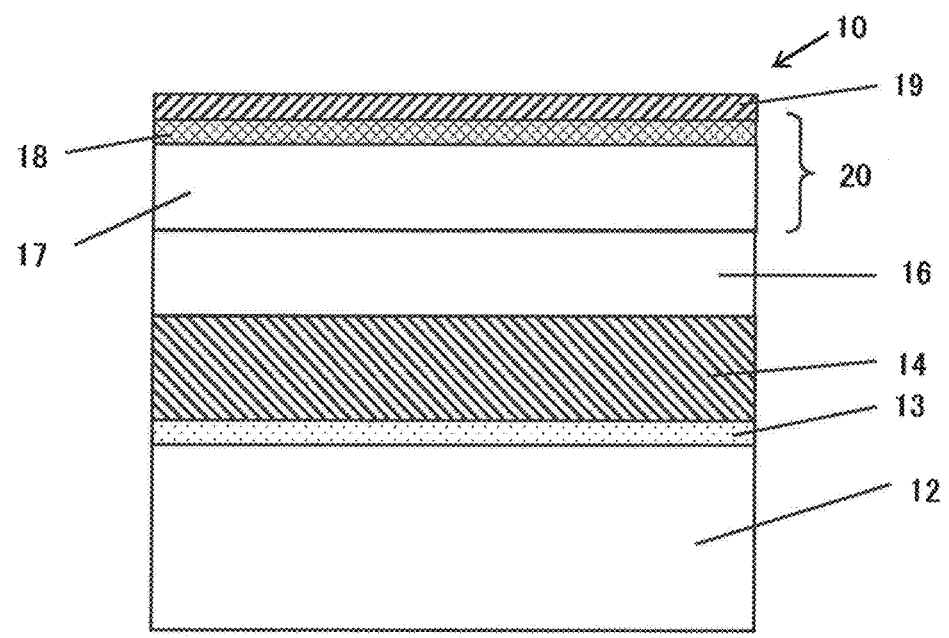
FIG. 1 is a sectional view depicting an example of an embodiment of an inventive epitaxial substrate for electronic devices.

An inventive epitaxial substrate 10 for electronic devices depicted in FIG. 1 includes a Si-based substrate 12, an AlN initial layer 13 provided on the Si-based substrate 12, and a buffer layer 14 provided on the AlN initial layer 13, and the roughness Sa of the surface of the AlN initial layer 13 on the side where the buffer layer 14 is located is 4 nm or more. Here, the roughness Sa is defined as roughness obtained by converting two-dimensional arithmetical average roughness Ra into three-dimensional roughness. Moreover, the Si-based substrate is a Si substrate or a SiC substrate.

The epitaxial substrate 10 for electronic devices of FIG. 1 can further include a high-resistance layer 16 provided on the buffer layer 14, a channel layer 17 provided, on the high-resistance layer 16, a barrier layer 18 provided on the channel layer 17, and a cap layer 19 provided on the barrier layer 18. Here, the channel layer 17 and the barrier layer 18 form an active layer 20.

The high-resistance layer 16 can be composed of, for example, a GaN layer containing C or Fe, the channel layer 17 can be composed of, for example, a GaN layer that contains less C or Fe than the high-resistance layer 16, the barrier layer 18 can be composed of, for example, an AlGaN layer, and the cap layer 19 can be composed of, for example, a GaN layer.

Figure 2:
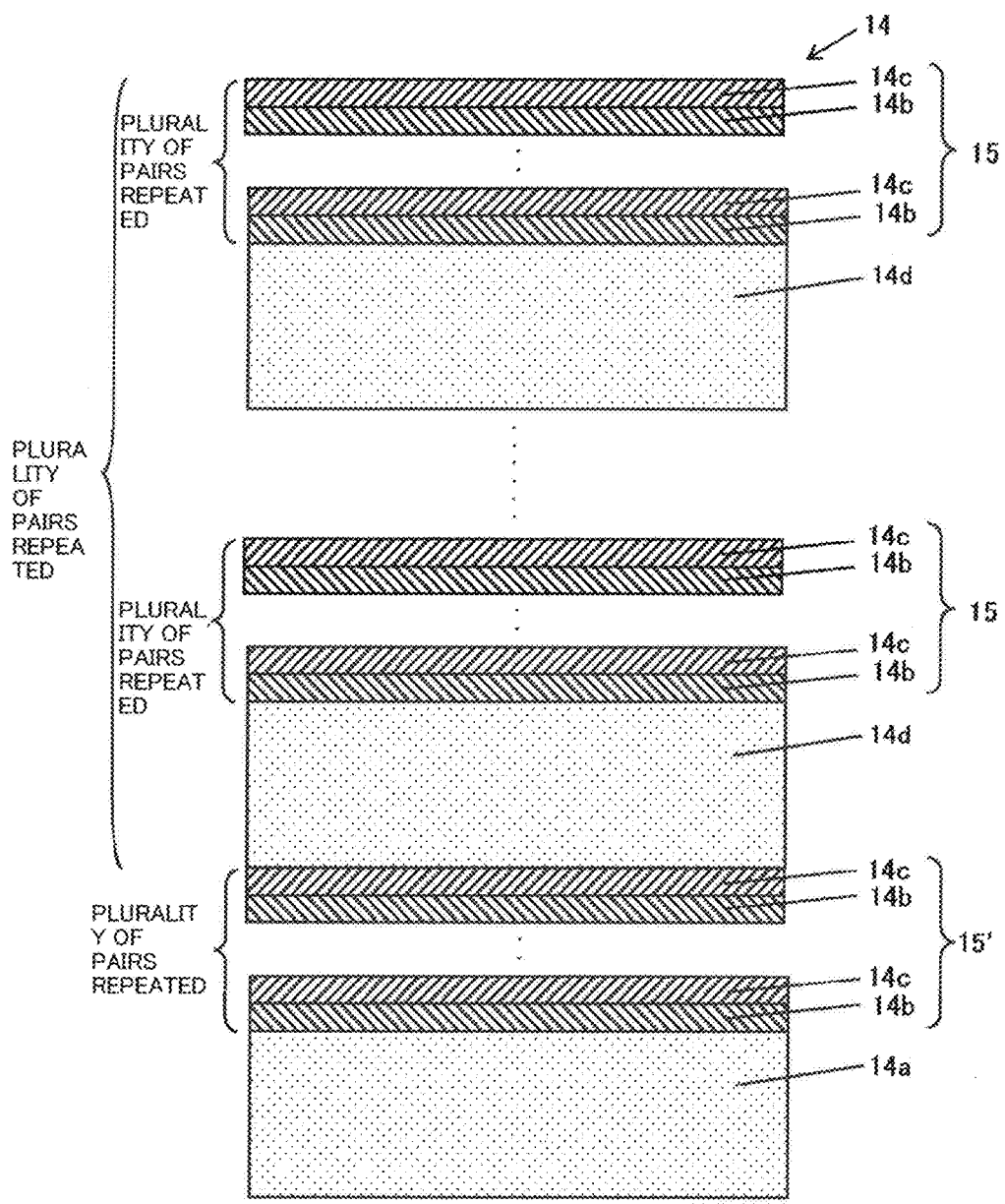
FIG. 2 is a sectional view depicting the detailed configuration of a buffer layer of the inventive epitaxial substrate for electronic devices.
Figure 3:
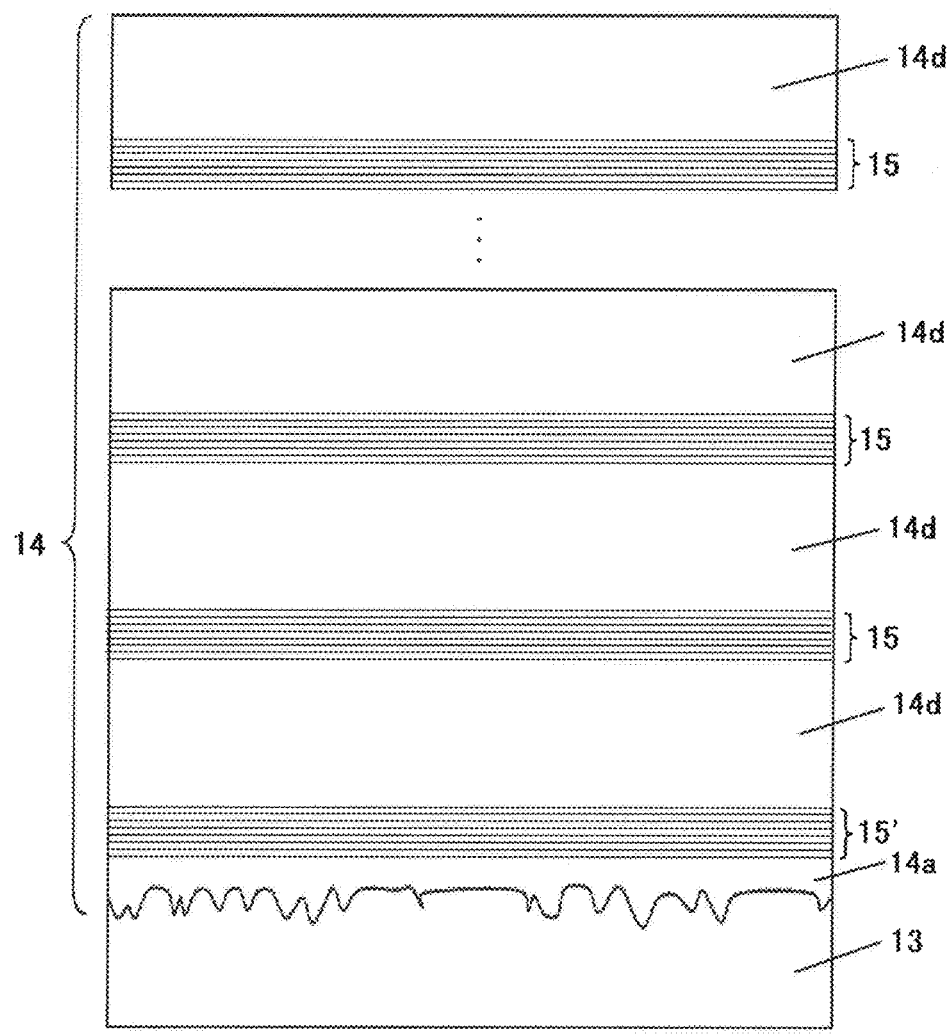
FIG. 3 is a sectional view depicting the detailed configuration also including the surface roughness of an AlN initial layer and the buffer layer of the inventive epitaxial substrate for electronic devices.

FIG. 2 depicts the detailed configuration of the buffer layer 14 and FIG. 3 depicts the detailed configuration also including the roughness Sa of the surface of the AlN initial layer 13 and the buffer layer 14. The buffer layer 14 can be composed of a first layer (an $Al_zGa_{1-z}N$ layer) 14a composed of $Al_zGa_{1-z}N$ (0≤z<1) and a first multilayer film (a multilayer film) 15' which are stacked. The first multilayer film 15' can be composed of $Al_xGa_{1-x}N$ (0<x≤1) layers 14b and $Al_yGa_{1-y}N$ (0≤y<x) layers 14c which are alternately stacked, and can be composed of a plurality of pairs of the $Al_xGa_{1-x}N$ layer 14b and the $Al_yGa_{1-y}N$ layer 14c, which are alternately stacked. Moreover, as depicted in FIG. 2, on the first multilayer film 15', a plurality of pairs of an insertion layer 14d and a second multilayer film 15 are alternately stacked or a single pair of the insertion layer 14d and the second multilayer film 15 is stacked (in FIG. 2, a plurality of pairs of the insertion layer 14d and the second multilayer film 15 are stacked thereon, but a single pair of the insertion layer 14d and the second multilayer film 15 may be stacked thereon).

The insertion layer 14d can be composed of an $Al_\alpha Ga_{1-\alpha}N$ (0≤α<1) layer, and the second multilayer film 15 can be composed of the $Al_xGa_{1-x}N$ (0<x≤1) layers 14b and the $Al_yGa_{1-y}N$ (0≤y<x) layers 14c which are alternately stacked.

By setting the roughness Sa of the surface of the AlN initial layer 13 on the side where the buffer layer 14 is located being set at 4 nm or more in the epitaxial substrate 10 for electronic devices, V pits can be suppressed in the structure of the buffer layer 14 formed on the AlN initial layer 13 and longitudinal leakage current characteristics can be improved when an electronic device is fabricated therewith.

In this case, in the epitaxial substrate 10 for electronic devices, it is preferable that roughness Sa of the surface of the AlN initial layer 13 is 8 nm or less.

As described above, when the roughness Sa of the surface of the AlN initial layer 13 on the side where the buffer layer 14 is located is 4 nm or more but 8 nm or less, it is possible to suppress surely V pits in the structure of the buffer layer 14 which is formed on the AlN initial layer 13.

In the epitaxial substrate 10 for electronic devices, it is preferable that the roughness Sa of the surface of the first layer 14a composed of $Al_zGa_{1-z}N$ (0≤z<1), which is in contact with the AlN initial layer 13, on the side opposite to the AlN initial layer 13 is 0.6 nm or less.

As described above, when the roughness Sa of the surface of the first layer 14a on the side opposite to the AlN initial layer 13 is 0.6 nm or less, it is possible to improve effectively longitudinal leakage current characteristics when an electronic device is fabricated therewith.

In the epitaxial substrate 10 for electronic devices, it is preferable that the roughness Sa of the surface of the first multilayer film 15', which is in contact with the first layer 14a, on the side opposite to the AlN initial layer 13 is 0.3 nm or less.

As described above, when the roughness Sa of the surface of the first multilayer film 15' on the side opposite to the first layer 14a is 0.3 nm or less, it is possible to improve more effectively longitudinal leakage current characteristics when an electronic device is fabricated therewith.

Next, with reference to FIG. 4, an example of an embodiment of an inventive electronic device will be described.

Figure 4:
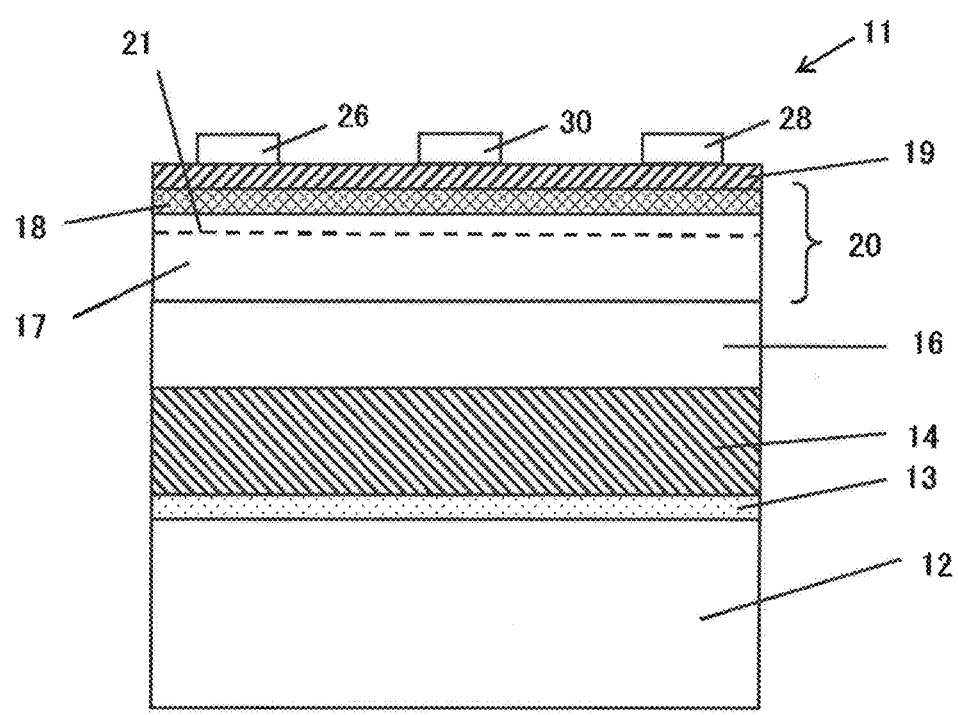
FIG. 4 is a sectional view depicting am example of an embodiment of an inventive electronic device.

An electronic device 11 of FIG. 4 is obtained by providing, on the cap layer 19 provided on the active layer 20 composed of the channel layer 17 and the barrier layer 18 of the epitaxial substrate 10 for electronic devices of FIG. 1, a source electrode 26, a drain electrode 28, and a gate electrode 30. In the electronic device 11, the source electrode 26 and the drain electrode 28 are disposed in such a way that a current flows into the drain electrode 28 from the source electrode 26 via a two dimensional electron gas layer 21 formed, in the channel layer 17. The current flowing between the source electrode 26 and the drain electrode 28 can be controlled by a potential which is applied to the gate electrode 30. Incidentally, the source electrode 26 and the drain electrode 28 only have to be connected to the two dimensional electron gas layer 21 with a low resistance and may be disposed in a region from which the cap layer 19 is removed or a region from which the cap layer 19 and the barrier layer 18 are removed.

Such an electronic device makes it possible to suppress V pits in the buffer layer structure which is formed on the AlN initial layer and improve longitudinal leakage current characteristics.

Next, with reference to FIGS. 1 to 3 and 5, an example of an embodiment of an inventive method for producing an epitaxial substrate for electronic devices will be described.

First, as depicted in FIG. 5(a), on a Si-based substrate 12 having a thickness of about 1 mm, an AlN initial layer 13 is formed by epitaxial growth with using MOVPE method (metal-organic vapor phase epitaxy method), for example, such that the thickness thereof becomes 20 to 200 nm.

Here, the roughness Sa of the surface of the AlN initial layer 13 is set at 4 nm or more, preferably, 4 nm or more but 8 nm or less. Incidentally, in the case of roughening the surface of the AlN initial layer 13, the roughness of the surface can be adjusted by changing the growth temperature, the gas flow rate, or the group-III element/group-V element ratio.

Next, as depicted in FIG. 5(b), on the AlN initial layer 13, a buffer layer 14 is formed by epitaxial growth by MOVPE method, for example.

Specifically, as depicted in FIG. 2, a first layer 14a which is composed of $Al_zGa_{1-z}N$ and has a thickness of about 100 to 500 nm and a first multilayer film 15', which is composed, of $Al_xGa_{1-x}N$ layers 14b having a thickness of about 3 to 7 nm and $Al_yGa_{1-y}N$ layers 14c having a thickness of about 2 to 5 nm that are alternated stacked, are stacked, and, further on the first multilayer film 15', insertion layers 14d, each being made of $Al_\alpha Ga_{1-\alpha}N$ and having a thickness of about 100 to 500 nm, and first multilayer films 15, each being composed of the $Al_xGa_{1-z}N$ layers 14b having a thickness of about 3 to 7 nm and the $Al_yGa_{1-y}N$ layers 14c having a thickness of about 2 to 5 nm that are alternately stacked, are alternately stacked to form the buffer layer 14. Here, the first layer 14a is formed so as to be thicker than each of the layers forming the first multilayer film 15' and the second multilayer film 15.

At this time, since the roughness Sa of the surface of the AlN initial layer 13 on the side where the buffer layer 14 is located is made large as described above, the lateral growth of the first layer 14a which is formed on the AlN initial layer 13 is promoted and filling of holes in the surface of the AlN initial layer 13 by the first layer 14a is promoted, whereby the surface after the growth of the first layer 14a becomes flat (see FIG. 3), which also makes it possible to improve the flatness of the first multilayer film 15' on the first layer 14a (see FIG. 3) and thereby improve longitudinal leakage current characteristics when an electronic device is fabricated therewith.

Figure 5:
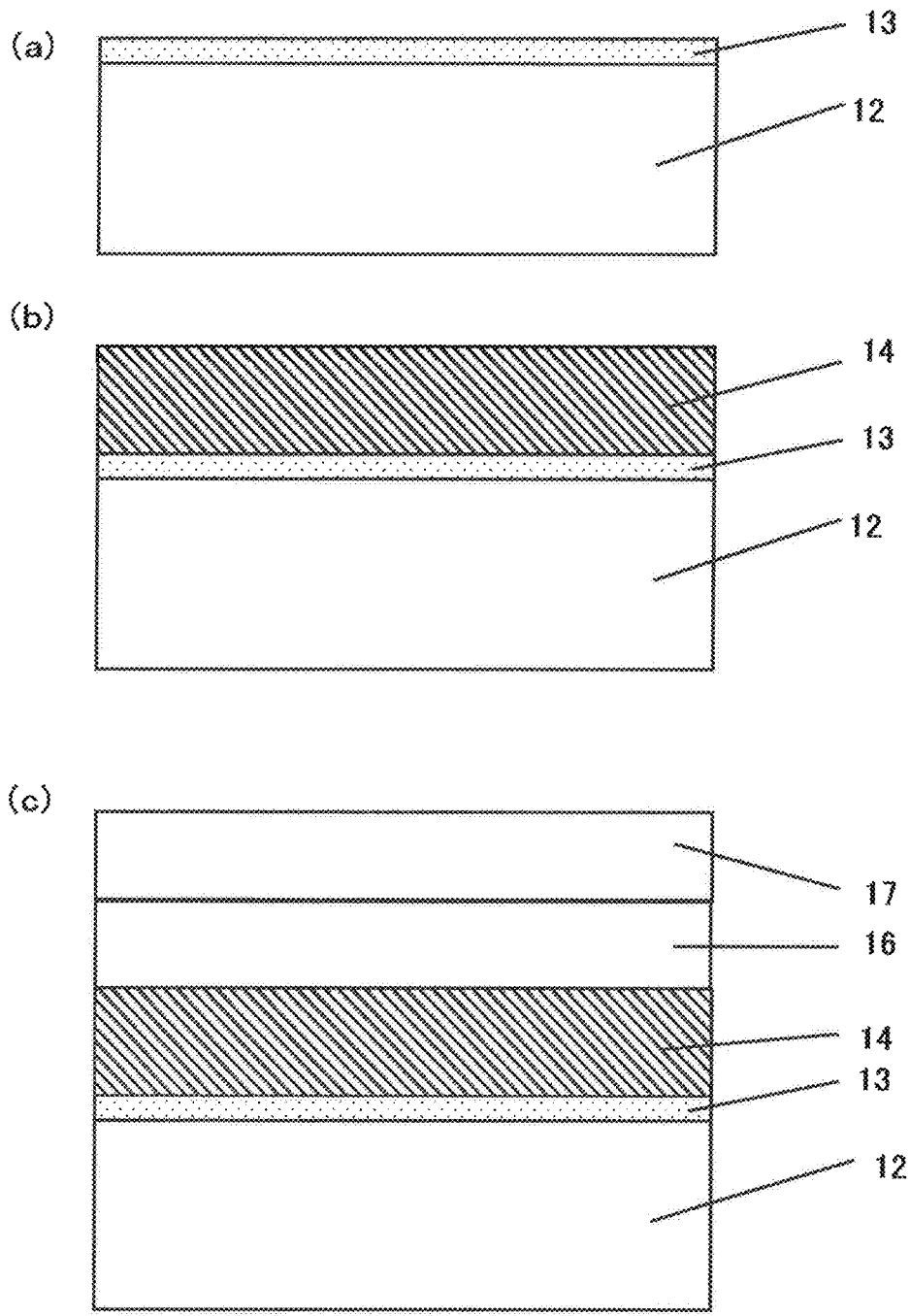
FIG. 5 is a process sectional view depicting a production flow of the inventive epitaxial substrate for electronic devices.

Next, as depicted in FIG. 5 (c), a high-resistance layer 16, for example, a GaN layer containing C or Fe and then a channel layer 17, for example, a GaN layer containing less at least C or Fe than the high-resistance layer 16 are formed by epitaxial growth with using MOVPE method, for example.

Next, a barrier layer 18, for example, an AlGaN layer, and thereon a cap layer 19, for example, a GaN layer are formed by epitaxial growth with using MOVPE method, for example; in this way, the epitaxial substrate 10 for electronic devices depicted in FIG. 1 can be produced.

With the above-described method for producing an epitaxial substrate for electronic devices, it is possible to produce an epitaxial substrate for electronic devices, in which V pits in the buffer layer structure which is formed on the AlN initial layer are suppressed and longitudinal leakage current characteristics are improved when an electronic device is fabricated therewith.

Next, an example of an embodiment of an inventive method for producing an electronic device will be described.

The epitaxial substrate 10 for electronic devices of FIG. 1 is produced in the manner described above, and, on the cap layer 19 on the active layer 20 composed of the channel layer 17 and the barrier layer 18 of the epitaxial substrate 10 for electronic devices, the source electrode 26, the drain electrode 28, and the gate electrode 30 are formed. The source electrode 26 and the drain electrode 28 can be formed as a Ti/Al stacked film, for example, and the gate electrode 30 can be formed as, for example, a stacked film of a lower film made of a metal oxide such as SiO or SiN and an upper film composed of a metal such as Ni, Au, Mo, or Pt. In this way, the electronic device 11 depicted in FIG. 4 can be obtained.

With the above-described method for producing an electronic device, it is possible to produce an electronic device in which V pits in the buffer layer structure which is formed on the AlN initial layer are suppressed and longitudinal leakage current characteristics are improved.

EXAMPLES

Hereinafter, the present invention will be described more specifically with Experimental Example, Example, and Comparative Example, but the present invention is not limited thereto.

Experimental Example

Figure 6:
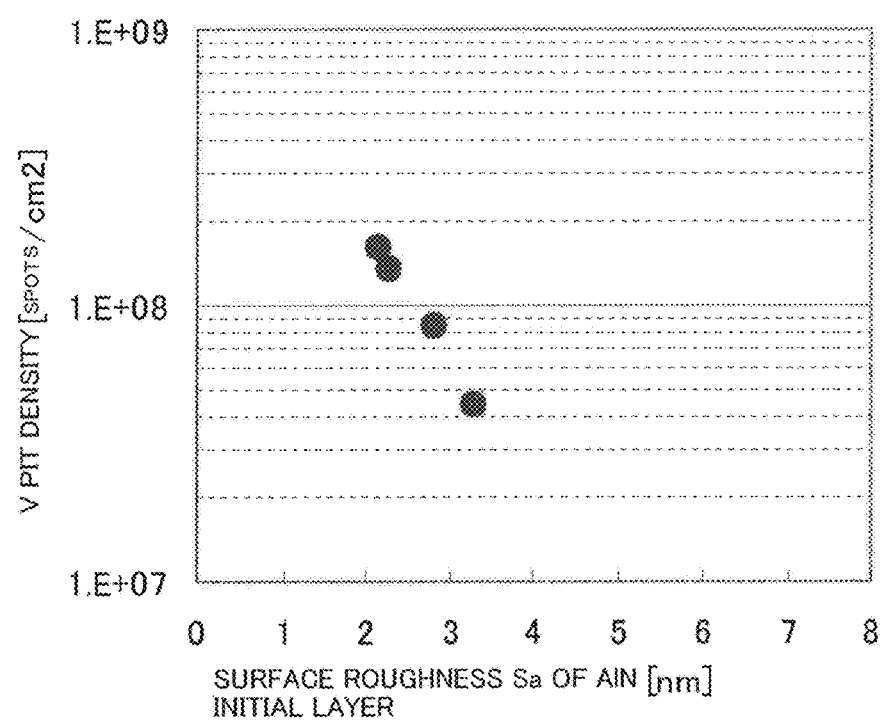
FIG. 6 is a diagram depicting the relationship between the V pit density in a buffer layer structure and the surface roughness Sa of an AlN initial layer in Experimental Example.
Figure 7:
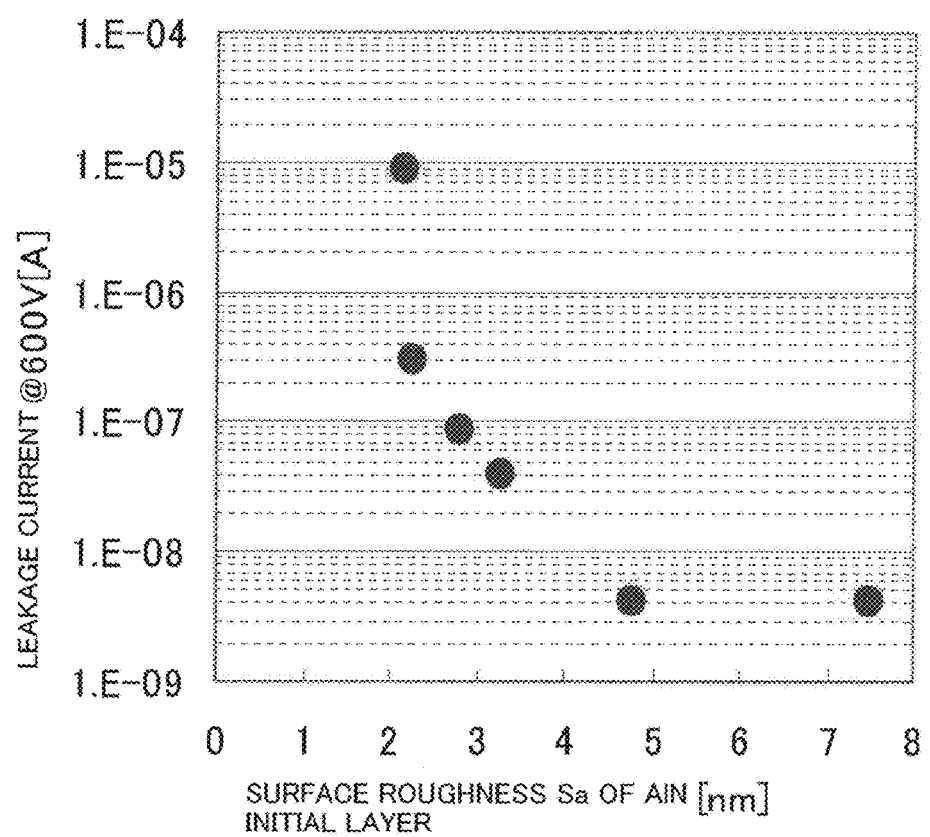
FIG. 7 is a diagram depicting the relationship between a longitudinal leakage current and the surface roughness Sa of the AlN initial layer in Experimental Example.

Epitaxial substrates 10 for electronic devices, each being the epitaxial substrate 10 depicted in FIG. 1, were produced with the roughness of the surface of the AlN initial layer being varied in the range between 2 nm and 7.5 nm (6 levels prepared). FIG. 6 depicts the relationship between the V pit density (spots/cm$^2$) in the buffer layer structure and the roughness Sa of the surface of the AlN initial layer. Moreover, FIG. 7 depicts the relationship between a longitudinal leakage current and the roughness Sa of the surface of the AlN initial layer. As is clear from FIG. 6, no V pit develops when the roughness of the surface of the AlN initial layer becomes 4 nm or more (almost no V pits are observed when the roughness of the surface of the AlN initial layer is 4 nm or more, and no point is plotted at the region of 4 nm or more in FIG. 6), and, as is clear from FIG. 7, the longitudinal leakage current is also improved when the roughness of the upper surface of the AlN initial layer is 4 nm or more.

Example

On a silicon substrate having a thickness of about 1 mm, an AlN initial layer 13 was grown so as to have a thickness of 160 nm by MOVPE method. Here, the AlN initial layer was formed at a growth temperature of 1100° C. to 1200° C., for example, 1130° C., and the roughness Sa of the surface of the AlN initial layer 13 was set at 4.79 nm.

Next, a buffer layer 14 was grown. The buffer layer 14 was formed by stacking a first layer 14a composed of GaN and having a thickness of 300 nm and a first multilayer film 15' and, further on the first multilayer film 15', alternately stacking insertion layers 14d, each being composed of GaN and having a thickness of 300 nm, and second multilayer films 15. The first multilayer film 15' and the second multilayer film 15 were each composed of AlN layers 14b having a thickness of 5 nm and GaN layers 14c having a thickness of 3 nm which were alternately stacked.

Next, a high carbon concentration layer (a high-resistance layer 16) composed of GaN and then a low carbon concentration layer (a channel layer 17) also composed of GaN were grown. Then, a barrier layer 18 composed of AlGaN and thereon a GaN layer (a cap layer 19) were grown, whereby the epitaxial substrate 10 for electronic devices of FIG. 1 was produced.

Figure 8:
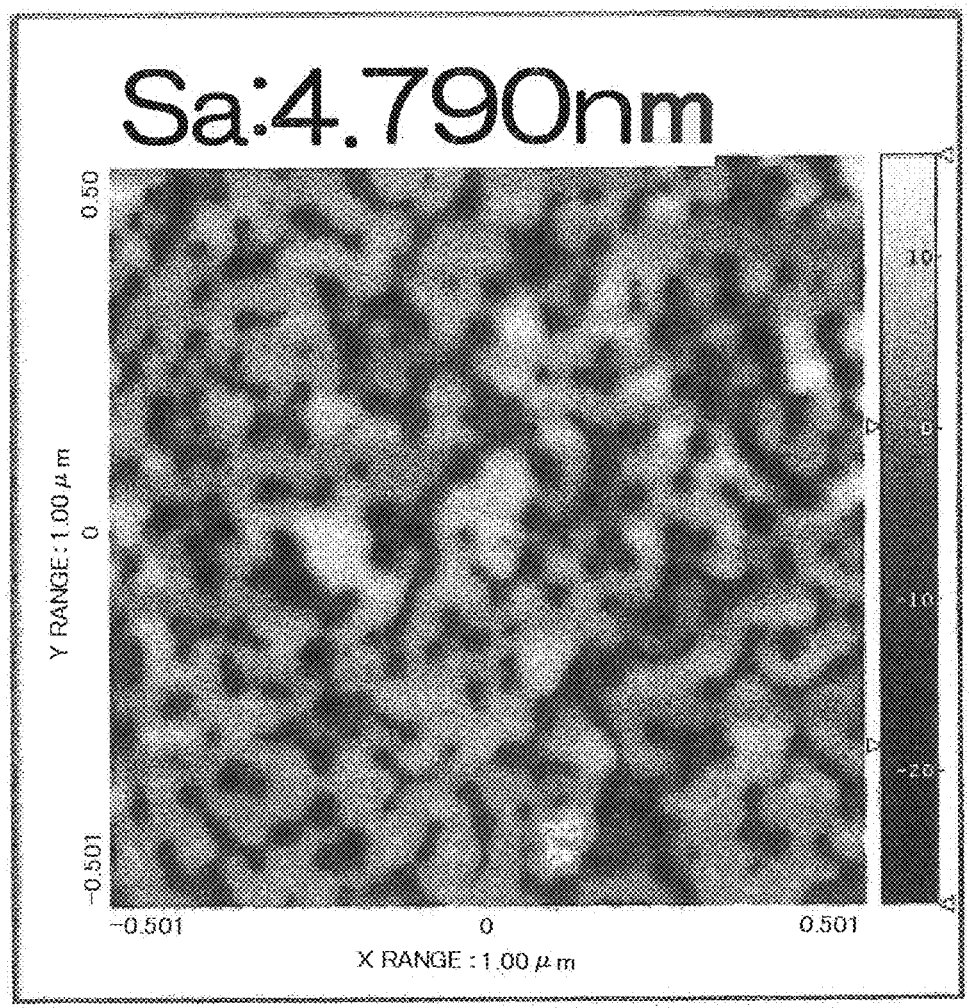
FIG. 8 is a diagram depicting a photograph of the surface of an AlN initial layer after the growth of the AlN initial layer in Example.

FIG. 8 depicts a photograph of the surface of the AlN initial layer 13. Moreover, FIG. 3 depicts the cross-section of the buffer layer 14 after epitaxial growth. As depicted therein, the surface of the AlN initial layer 13 has projections and depressions, but the surface of the first layer 14a formed thereon is flat.

FIG. 9 depicts photographs of the surface of the first layer 14a. The roughness Sa of the surface of the first layer 14a became 0.6 nm or less. Incidentally, three photographs of FIG. 9 are photographs of three different wafers.

Figure 10:
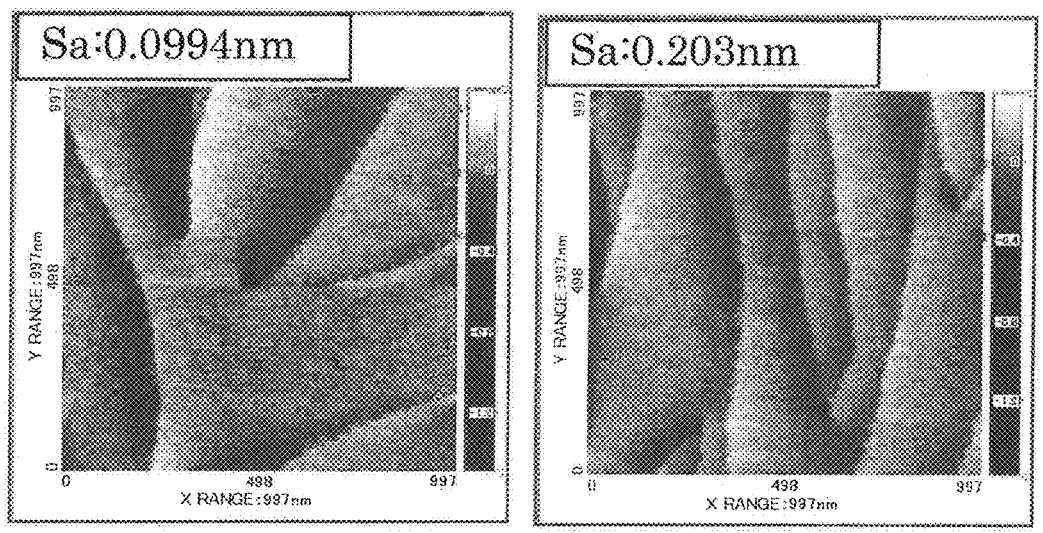
FIG. 10 is a diagram depicting photographs of the surface of a first multilayer film, after the growth of the first multilayer film in Example.

FIG. 10 depicts photographs of the surface of the first multilayer film 15'. The roughness Sa of the surface of the first multilayer film 15f became 0.3 nm or less. Incidentally, two photographs of FIG. 10 are photographs of two different wafers.

On this epitaxial substrate for electronic devices, electrodes were formed, whereby the electronic device 11 depicted in FIG. 4 was produced. A voltage of 600 V was applied thereto and a longitudinal (thickness-direction) leakage current was measured. The result was $4\times10^{-9}$ (A), which revealed that it was possible to suppress the longitudinal leakage current greatly compared to Comparative Example, which will be described below.

Comparative Example

An epitaxial substrate 10 for electronic devices was produced in a manner similar to Example. However, the AlN initial layer 13 was formed at a growth temperature of 1240° C. and the roughness Sa of the surface of the AlN initial layer was set at 2.16 nm. The others were the same as those of Example.

Figure 11:
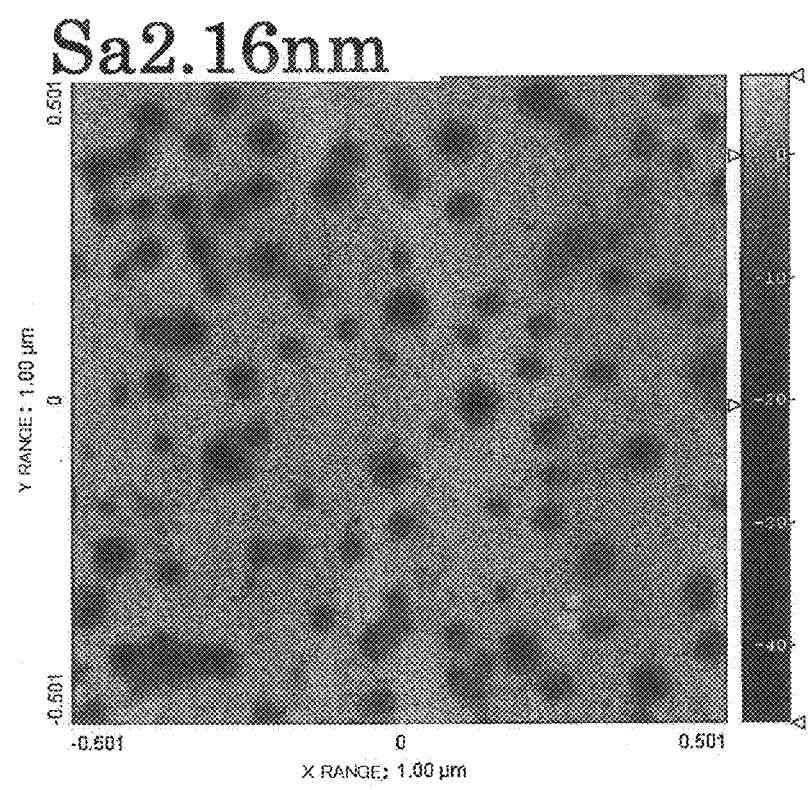
FIG. 11 is a diagram depicting a photograph of the surface of an AlN initial layer after the growth of the AlN initial layer in Comparative Example.
Figure 12:
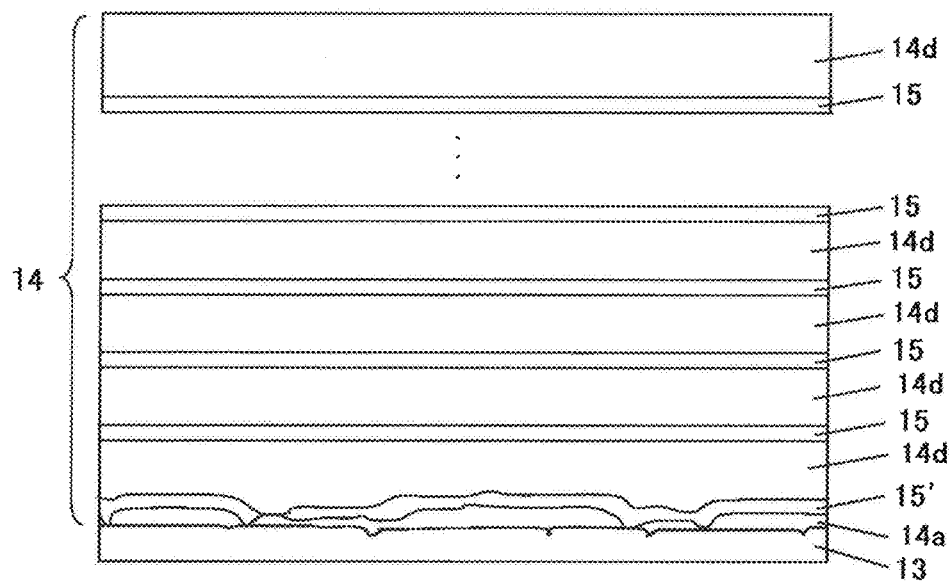
FIG. 12 is a sectional view depicting the detailed configuration also including the surface roughness of the AlN initial layer and a buffer layer of an epitaxial substrate for electronic devices of Comparative Example.

FIG. 11 depicts a photograph of the surface of the AlN initial layer 13. Moreover, FIG. 12 depicts the cross-section of the AlN initial layer 13 and the buffer layer 14 after epitaxial growth. As depicted therein, although the surface of the AlN initial layer 13 is flat, the surface of the first layer 14a formed thereon and the surface of the first multilayer film 15' have projections and depressions. On this semiconductor epitaxial wafer, electrodes were formed, whereby the electronic device 11 depicted in FIG. 4 was produced. A voltage of 600 V was applied thereto and a longitudinal leakage current was measured. The result was $8.6\times10^{-6}$ (A).

It is to be understood that the present invention is not limited in any way by the embodiment thereof described above. The above embodiment is merely an example, and anything that has substantially the same structure as the technical idea recited in the claims of the present invention and that offers similar workings and benefits falls within the technical scope of the present invention. For example, the first multilayer film 15' and the second multilayer film 15 each may be a single layer with a gradient in the Al composition. Moreover, the second multilayer film 15 or the insertion layer 14 may not be provided.

The invention claimed is:

1. A method for producing an electronic device, comprising:
    forming an AlN initial layer on a Si-based substrate;
    forming a buffer layer on the AlN initial layer;
    forming a channel layer on the buffer layer;
    forming a barrier layer on the channel layer;
    forming a cap layer on the barrier layer; and
    forming electrodes on the cap layer,
    wherein
    a roughness Sa of a surface of the AN initial layer on a side where the buffer layer is located is set at 4 nm or more and 8 nm or less.

2. A method for producing an epitaxial substrate for electronic devices, comprising:
    forming an AlN initial layer on a Si-based substrate;
    forming a buffer layer on the AlN initial layer;
    forming a channel layer on the buffer layer;
    forming a barrier layer on the channel layer; and
    forming a cap layer on the barrier layer,
    wherein
    a roughness Sa of a surface of the AlN initial layer on a side where the buffer layer is located is set at 4 nm or more and 8 nm or less.

3. An epitaxial substrate for electronic devices, comprising:
    a Si-based substrate;
    an AlN initial layer provided on the Si-based substrate;
    a buffer layer provided on the AlN initial layer;
    a channel layer provided on the buffer layer;
    a barrier layer provided on the channel layer; and
    a cap layer provided on the barrier layer,
    wherein a roughness Sa of a surface of the AlN initial layer on a side where the buffer layer is located is 4 nm or more, and 8 nm or less.

4. An electronic device that is fabricated by using the epitaxial substrate for electronic devices according to claim 3, wherein on the epitaxial substrate for electronic devices, electrodes are provided.

5. The epitaxial substrate for electronic devices according to claim 3, wherein
    the buffer layer includes an $Al_zGa_{1-z}N$ ($0 \leq z < 1$) layer which is in contact with the AlN initial layer, and
    a roughness Sa of a surface of the $Al_zGa_{1-z}N$ ($0 \leq z < 1$) layer on a side opposite to the AlN initial layer is 0.6 nm or less.

6. An electronic device that is fabricated by using the epitaxial substrate for electronic devices according to claim 5, wherein on the epitaxial substrate for electronic devices, electrodes are provided.

7. The epitaxial substrate for electronic devices according to claim 5, wherein
    the buffer layer includes a multilayer film that is in contact with the $Al_zGa_{1-z}N$ ($0 \leq z < 1$) layer and is composed of $Al_xGa_{1-x}N$ ($0 < x \leq 1$) layers and $Al_yGa_{1-y}N$ ($0 \leq y < x$) layers which are alternately stacked, and
    a roughness Sa of a surface of the multilayer film on a side opposite to the $Al_zGa_{1-z}N$ ($0 \leq z < 1$) layer is 0.3 nm or less.

8. An electronic device that is fabricated by using the epitaxial substrate for electronic devices according to claim 7, wherein
    on the epitaxial substrate for electronic devices, electrodes are provided.

* * * * *